(12) United States Patent
Edwards

(10) Patent No.: US 9,252,338 B2
(45) Date of Patent: Feb. 2, 2016

(54) METHODS AND APPARATUS FOR IMPLEMENTING COLOR CONSISTENCY IN REMOTE WAVELENGTH CONVERSION

(71) Applicant: Intematix Corporation, Fremont, CA (US)

(72) Inventor: Charles Edwards, Pleasanton, CA (US)

(73) Assignee: Intematix Corporation, Fremont, CA (US)

( * ) Notice: Subject to any disclaimer, the term of this patent is extended or adjusted under 35 U.S.C. 154(b) by 252 days.

(21) Appl. No.: 13/871,383

(22) Filed: Apr. 26, 2013

(65) Prior Publication Data

US 2013/0286632 A1    Oct. 31, 2013

Related U.S. Application Data

(60) Provisional application No. 61/639,048, filed on Apr. 26, 2012.

(51) Int. Cl.
| | |
|---|---|
| *H01L 33/50* | (2010.01) |
| *F21V 9/16* | (2006.01) |
| *F21V 3/04* | (2006.01) |
| *F21V 3/02* | (2006.01) |
| *F21K 99/00* | (2010.01) |
| *F21Y 101/02* | (2006.01) |

(52) U.S. Cl.
CPC .............. *H01L 33/502* (2013.01); *F21V 3/02* (2013.01); *F21V 3/0463* (2013.01); *F21V 3/0481* (2013.01); *F21V 9/16* (2013.01); *F21K 9/56* (2013.01); *F21Y 2101/02* (2013.01)

(58) Field of Classification Search
CPC ... H01L 33/502; F21V 3/0481; F21V 3/0463; F21V 3/02; F21K 9/56
USPC .............. 313/498–512; 362/84, 510, 166, 293
See application file for complete search history.

(56) References Cited

U.S. PATENT DOCUMENTS

| | | |
|---|---|---|
| 3,290,255 A | 12/1966 | Smith |
| 3,593,055 A | 7/1971 | Geusic et al. |
| 3,670,193 A | 6/1972 | Thorington et al. |
| 3,676,668 A | 7/1972 | Collins et al. |
| 3,691,482 A | 9/1972 | Pinnow et al. |
| 3,709,685 A | 1/1973 | Hercock et al. |
| 3,743,833 A | 7/1973 | Martie et al. |
| 3,763,405 A | 10/1973 | Mitsuhata |

(Continued)

FOREIGN PATENT DOCUMENTS

| | | |
|---|---|---|
| EP | 647694 | 4/1995 |
| GB | 2 017 409 | 10/1979 |

(Continued)

OTHER PUBLICATIONS

Machine Translation of JP 2007-035802 A.*

(Continued)

*Primary Examiner* — Nimeshkumar Patel
*Assistant Examiner* — Jose M Diaz
(74) *Attorney, Agent, or Firm* — Vista IP Law Group, LLP

(57) ABSTRACT

Disclosed is an approach to implement a light emitting device with remote wavelength conversion. Lighting arrangements are disclosed which provides consistent color despite inconsistent light path lengths for phosphor light conversions.

36 Claims, 12 Drawing Sheets

(56) References Cited

U.S. PATENT DOCUMENTS

| | | | |
|---|---|---|---|
| 3,793,046 A | 2/1974 | Wanmaker et al. | |
| 3,819,973 A | 6/1974 | Hosford | |
| 3,819,974 A | 6/1974 | Stevenson et al. | |
| 3,849,707 A | 11/1974 | Braslau et al. | |
| 3,875,456 A | 4/1975 | Kano et al. | |
| 3,932,881 A | 1/1976 | Mita et al. | |
| 3,937,998 A | 2/1976 | Verstegen et al. | |
| 3,972,717 A | 8/1976 | Wiedemann | |
| 4,047,075 A | 9/1977 | Schoberl | |
| 4,081,764 A | 3/1978 | Christmann et al. | |
| 4,104,076 A | 8/1978 | Pons | |
| 4,143,394 A | 3/1979 | Schoeberl | |
| 4,176,294 A | 11/1979 | Thornton, Jr. | |
| 4,176,299 A | 11/1979 | Thornton | |
| 4,211,955 A | 7/1980 | Ray | |
| 4,305,019 A | 12/1981 | Graff et al. | |
| 4,315,192 A | 2/1982 | Skwirut et al. | |
| 4,443,532 A | 4/1984 | Joy et al. | |
| 4,559,470 A | 12/1985 | Murakami et al. | |
| 4,573,766 A | 3/1986 | Bournay, Jr. et al. | |
| 4,618,555 A | 10/1986 | Suzuki et al. | |
| 4,638,214 A | 1/1987 | Beers et al. | |
| 4,667,036 A | 5/1987 | Iden et al. | |
| 4,678,285 A | 7/1987 | Ohta et al. | |
| 4,727,003 A | 2/1988 | Ohseto et al. | |
| 4,772,885 A | 9/1988 | Uehara et al. | |
| 4,845,223 A | 7/1989 | Seybold et al. | |
| 4,859,539 A | 8/1989 | Tomko et al. | |
| 4,915,478 A | 4/1990 | Lenko et al. | |
| 4,918,497 A | 4/1990 | Edmond | |
| 4,946,621 A | 8/1990 | Fouassier et al. | |
| 4,992,704 A | 2/1991 | Stinson | |
| 5,077,161 A | 12/1991 | Law | |
| 5,110,931 A | 5/1992 | Dietz et al. | |
| 5,126,214 A | 6/1992 | Tokailin et al. | |
| 5,131,916 A | 7/1992 | Eichenauer et al. | |
| 5,143,433 A | 9/1992 | Farrell | |
| 5,143,438 A | 9/1992 | Giddens et al. | |
| 5,166,761 A | 11/1992 | Olson et al. | |
| 5,208,462 A | 5/1993 | O'Connor et al. | |
| 5,210,051 A | 5/1993 | Carter, Jr. | |
| 5,211,467 A | 5/1993 | Seder | |
| 5,237,182 A | 8/1993 | Kitagawa et al. | |
| 5,264,034 A | 11/1993 | Dietz et al. | |
| 5,283,425 A | 2/1994 | Imamura | |
| 5,369,289 A | 11/1994 | Tamaki et al. | |
| 5,405,709 A | 4/1995 | Littman et al. | |
| 5,439,971 A | 8/1995 | Hyche | |
| 5,518,808 A | 5/1996 | Bruno et al. | |
| 5,535,230 A | 7/1996 | Abe | |
| 5,557,168 A | 9/1996 | Nakajima et al. | |
| 5,563,621 A | 10/1996 | Silsby | |
| 5,578,839 A | 11/1996 | Nakamura et al. | |
| 5,583,349 A | 12/1996 | Norman et al. | |
| 5,585,640 A | 12/1996 | Huston et al. | |
| 5,619,356 A | 4/1997 | Kozo et al. | |
| 5,660,461 A | 8/1997 | Ignatius et al. | |
| 5,677,417 A | 10/1997 | Muellen et al. | |
| 5,679,152 A | 10/1997 | Tischler et al. | |
| 5,763,901 A | 6/1998 | Komoto et al. | |
| 5,770,887 A | 6/1998 | Tadatomo et al. | |
| 5,771,039 A | 6/1998 | Ditzik | |
| 5,777,350 A | 7/1998 | Nakamura et al. | |
| 5,869,199 A | 2/1999 | Kido | |
| 5,959,316 A | 9/1999 | Lowery | |
| 5,962,971 A * | 10/1999 | Chen | 313/512 |
| 5,998,925 A | 12/1999 | Shimizu | |
| 6,137,217 A | 10/2000 | Pappalardo et al. | |
| 6,340,824 B1 | 1/2002 | Komoto et al. | |
| 6,504,301 B1 | 1/2003 | Lowery | |
| 6,576,488 B2 | 6/2003 | Collins et al. | |
| 6,600,175 B1 | 7/2003 | Baretz et al. | |
| 6,642,618 B2 | 11/2003 | Yagi et al. | |
| 6,642,652 B2 | 11/2003 | Collins et al. | |
| 6,869,812 B1 | 3/2005 | Liu | |
| 7,153,015 B2 | 12/2006 | Brukilacchio | |
| 7,311,858 B2 | 12/2007 | Wang | |
| 7,390,437 B2 | 6/2008 | Dong | |
| 7,479,662 B2 | 1/2009 | Soules et al. | |
| 7,575,697 B2 | 8/2009 | Li | |
| 7,601,276 B2 | 10/2009 | Li | |
| 7,615,795 B2 | 11/2009 | Baretz et al. | |
| 7,655,156 B2 | 2/2010 | Cheng | |
| 7,943,945 B2 | 5/2011 | Baretz et al. | |
| 7,999,283 B2 * | 8/2011 | Chakraborty et al. | 257/100 |
| 8,334,644 B2 | 12/2012 | Ramer et al. | |
| 8,384,105 B2 * | 2/2013 | Tetz et al. | 257/98 |
| 8,735,926 B2 * | 5/2014 | Sakai et al. | 257/98 |
| 8,803,412 B2 * | 8/2014 | Sanders et al. | 313/485 |
| 8,870,431 B2 * | 10/2014 | Lin et al. | 362/606 |
| 2003/0038596 A1 * | 2/2003 | Ho | 313/512 |
| 2004/0012027 A1 * | 1/2004 | Keller et al. | 257/79 |
| 2004/0016938 A1 | 1/2004 | Baretz et al. | |
| 2004/0217364 A1 * | 11/2004 | Tarsa et al. | 257/89 |
| 2005/0221519 A1 * | 10/2005 | Leung et al. | 438/27 |
| 2006/0049416 A1 | 3/2006 | Baretz et al. | |
| 2006/0158090 A1 | 7/2006 | Wang | |
| 2008/0111472 A1 | 5/2008 | Liu | |
| 2008/0224597 A1 | 9/2008 | Baretz et al. | |
| 2008/0224598 A1 | 9/2008 | Baretz et al. | |
| 2008/0231181 A1 * | 9/2008 | Pang | 313/512 |
| 2009/0057698 A1 * | 3/2009 | Okamura et al. | 257/98 |
| 2009/0184333 A1 | 7/2009 | Wang et al. | |
| 2009/0262516 A1 | 10/2009 | Li | |
| 2009/0283721 A1 | 11/2009 | Liu | |
| 2009/0315051 A1 | 12/2009 | Wu et al. | |
| 2010/0067240 A1 | 3/2010 | Selverian et al. | |
| 2010/0238659 A1 | 9/2010 | Fann | |
| 2011/0096560 A1 | 4/2011 | Ryu et al. | |
| 2011/0149578 A1 | 6/2011 | Niiyama et al. | |
| 2011/0216522 A1 | 9/2011 | Harbers et al. | |
| 2011/0227102 A1 | 9/2011 | Hussell et al. | |
| 2011/0256647 A1 * | 10/2011 | Shaikevitch | 438/27 |
| 2012/0020092 A1 | 1/2012 | Bailey | |
| 2012/0033404 A1 | 2/2012 | Wu et al. | |
| 2012/0126260 A1 * | 5/2012 | Hussell et al. | 257/88 |
| 2012/0138874 A1 * | 6/2012 | Yuan et al. | 252/582 |
| 2013/0057140 A1 * | 3/2013 | Falicoff et al. | 313/483 |
| 2013/0092969 A1 * | 4/2013 | Hikmet et al. | 257/98 |
| 2013/0235586 A1 | 9/2013 | Gielen et al. | |
| 2013/0267051 A1 * | 10/2013 | Petersen | 438/29 |
| 2013/0293098 A1 * | 11/2013 | Li et al. | 313/512 |
| 2013/0306998 A1 * | 11/2013 | Ulasyuk | 257/88 |
| 2013/0307010 A1 * | 11/2013 | Hikmet et al. | 257/98 |
| 2015/0084499 A1 | 3/2015 | Wu et al. | |

FOREIGN PATENT DOCUMENTS

| | | |
|---|---|---|
| JP | S50-79379 | 11/1973 |
| JP | 60170194 | 9/1985 |
| JP | 862-189770 | 8/1987 |
| JP | H01-1794 71 | 7/1989 |
| JP | 01-260707 | 10/1989 |
| JP | H02-91980 | 3/1990 |
| JP | H3-24692 | 3/1991 |
| JP | 4010665 | 1/1992 |
| JP | 4010666 | 1/1992 |
| JP | 04-289691 | 10/1992 |
| JP | 4-321280 | 11/1992 |
| JP | 05-152609 | 6/1993 |
| JP | 6207170 | 7/1994 |
| JP | 6-267301 | 9/1994 |
| JP | 6283755 | 10/1994 |
| JP | 07-099345 | 4/1995 |
| JP | H07-176794 | 7/1995 |
| JP | 07-235207 | 9/1995 |
| JP | H7-282609 | 10/1995 |
| JP | H08-7614 | 1/1996 |
| JP | 8-250281 | 9/1996 |
| JP | 2900928 | 3/1999 |
| JP | 2000022216 A | 1/2000 |
| JP | P2003-234513 | 8/2003 |
| JP | P3724490 | 9/2005 |
| JP | P3724498 | 9/2005 |

(56) References Cited

FOREIGN PATENT DOCUMENTS

| | | |
|---|---|---|
| JP | 2007035802 A | 2/2007 |
| JP | 2007287814 A | 11/2007 |
| JP | 2012043837 A | 3/2012 |
| WO | WO 9108508 | 6/1991 |
| WO | 2010074963 | 7/2010 |

OTHER PUBLICATIONS

"Fraunhofer-Gesellschafl: Research News Special1997", http://www.fhg.de/press/md-e/md1997/sondert2.hlm,(accessed on Jul. 23, 1998), Jan. 1997, Publisher: Fraunhofer Institute.

Adachi, C. et al., "Blue light-emitting organic electroluminescent devices", "Appl. Phys. Lett.", Feb. 26, 1990, pp. 799-801, vol. 56, No. 9.

Akasaki, Isamu, et al., "Photoluminescence of Mg-doped p-type GaN and electroluminescence of GaN p-n junction LED", "Journal of Luminescence", Jan.-Feb. 1991, pp. 666-670, vol. 48-49 pt. 2.

Amano, H., et al., "UV and blue electroluminescence from Al/GaN:Mg/GaN LED treated with low-energy electron beam irradiation (LEEBI)", "Institute of Physics: Conference Series", 1990, pp. 725-730, vol. 106, No. 10.

Apr. 14, 2010 Office Action in U.S. Appl. No. 11/264,124.

Apr. 15, 2009 Office Action in U.S. Appl. No. 11/264,124, issued by Abu I Kalam.

Armaroli, N. et al., "Supramolecular Photochemistry and Photophysics.", "J. Am. Chern. Soc.", 1994, pp. 5211-5217, vol. 116.

Aug. 21, 2006 Office Action in U.S. Appl. No. 10/623,198, issued by Thao X. Le.

Aug. 24, 2007 Office Action in U.S. Appl. No. 11/264,124, issued by Thao X. Le.

Aug. 26, 2010 Office Action in U.S. Appl. No. 12/131,118.

Berggren, M. et al., "Light-emitting diodes with variable colours from polymer blends", "Nature", Dec. 1, 1994, pp. 444-446, vol. 372.

Berggren, M., et al., "White light from an electroluminescent diode made from poly[3(4-octylphenyl)-2,2'-bithiophene] and an oxadiazole . . . ", "Journal of Applied Physics", Dec. 1994, pp. 7530-7534, vol. 76, No. 11.

Boonkosum, W. et al., "Novel Flat Panel display made of amorphous SiN:H/SiC:H thin film LED", "Physical Concepts and Materials for Novel Optoelectronic Device Applications II", 1993, pp. 40-51, vol. 1985.

Bradfield, P.L., et al., "Electroluminescence from sulfur impurities in a p-n junction formed in epitaxial silicon", "Appl. Phys. Lett", 07110/1989, pp. 10D-102, vol. 55, No. 2.

Chao, Zhang Jin, et al., "White light emitting glasses", "Journal of Solid State Chemistry", 1991, pp. 17-29, vol. 93.

Comrie, M. , "Full Color LED Added to Lumex's Lineup", "EBN", Jun. 19, 1995, p. 28.

CRC Handbook, 63rd Ed., (1983) p. E-201.

Das, N.C., et al., "Luminescence spectra of ann-channel metal-oxide-semiconductor field-effect transistor at breakdown", 1990, pp. 1152-1153, vol. 56, No. 12.

Dec. 16. 2004 Office Action in U.S. Appl. No. 10/623,198, issued by Thao X. Le.

Dictionary Definition of Phosphor, Oxford English Dictionary Online, Mar. 9, 2012 (Only partial available due to corrupt file as provided, on Mar. 22, 2012 in U.S. Appl. No. 12/131,119; Request for Full Reference filed).

El Jouhari, N., et al., "White light generation using fluorescent glasses activated by Ce3+, Tb3+ and Mn2+ ions", "Journal De Physique IV, Colloque C2", Oct. 1992, pp. 257-260, vol. 2.

Feb. 21, 2012 Office Action in U.S. Appl. No. 12/131,118, issued by Abul Kalam.

Feb. 26, 2008 Office Action in U.S. Appl. No. 11/264,124, issued by Abu I Kalam.

Feb. 4, 2005 Office Action in U.S. Appl. No. 10/623,198, issued by Thao X. Le.

Feb. 7, 2007 Office Action in U.S. Appl. No. 11/264,124, issued by Thao X. Le.

Forrest, S. et al. , "Organic emitters promise a new generation of displays", "Laser Focus World", Feb. 1995, pp. 99-107.

Hamada, Y. et al., "Blue-Light-Emitting Organic Electroluminescent Devices with Oxadiazole Dimer Dyes as an Emitter", "Jpn. J. Appl. Physics", Jun. 1992, pp. 1812-1816, vol. 31.

Hamakawa, Yoshihiro, et al., "Toward a visible light display by amorphous SiC:H alloy system", "Optoelectronics—Devices and Technologies", Dec. 1989, pp. 281-294, vol. 4, No. 2.

Hirano, Masao, et al., "Various performances of fiber-optical temperature sensor utilizing infrared-to-visible conversion phosphor", "Electrochemisty (JP)", Feb. 1987, pp. 158-164, vol. 55, No. 2, Publisher: Electrochemical Society of Japan.

Jang, S., "Effect of Avalanche-Induced Light Emission on the Multiplication Factor in Bipolar Junction Transistors", "Solid-State Electronics", 1991, pp. 1191-1196, vol. 34, No. 11.

Jan. 29, 2007 Office Action in U.S. Appl. No. 10/623,198, issued by Thao X. Le.

Jan. 30, 2006 Office Action in U.S. Appl. No. 11/264,124, issued by Thao X. Le.

Jan. 7, 2011 Office Action in U.S. Appl. No. 12/131,119, issued by Steven Y. Horikoshi.

Jul. 10, 2008 Office Action in U.S. Appl. No. 11/264,124, issued by Abu I Kalam.

Jul. 14, 2005 Notice of Allowance, Notice of Allowability, and Examiner's Statement of Reasons for Allowance in U.S. Appl. No. 10/623,198, issued by Thao X. Le.

Jul. 14, 2011 Office Action in U.S. Appl. No. 12/131,119, issued by Steve Horikoshi.

Jul. 7, 2011 Office Action in U.S. Appl. No. 12/131,118, issued by Abu I Kalam.

Jun. 14, 2006 Office Action in U.S. Appl. No. 11/264,124, issued by Thao X. Le.

Jun. 26, 2007 Office Action in U.S. Appl. No. 10/623,198, issued by Thao X. Le.

Kido, J. et al. , "1,2,4-Triazole Derivative as an Electron Transport Layer in Organic Luminescent Devices", "Jpn. J. Appl. Phys.", Jul. 1, 1993, pp. L917-L920, vol. 32.

Kido, J. et al. , "Bright blue electroluminescence from poly(N-vinylcarbazole)", "Appl. Phys. Letters", Nov. 8, 1993, pp. 2627-2629, vol. 63, No. 19.

Kido, J., et al., "White light-emitting organic electroluminescent devices using the poly(N-vinylcarbazole) emitter layer doped with . . . ", "Appl. Phys. Lett.", Feb. 14, 1994, pp. 815-817, vol. 64, No. 7.

Krames, M., et al., "Status and Future of High-Power Light-Emitting Diodes for Solid-Slate Lighting", "Journal of Display Technology", Jun. 2007, pp. 160-175, vol. 3, No. 2.

Kudryashov, V., et al., "Spectra of Superbright Blue and Green InGaN/AlGaN/GaN Light-Emitting diodes", "Journal of the European Ceramic Society", May 1996, pp. 2033-2037, vol. 17.

Larach, S., et al., "Blue emitting luminescent phosphors: Review and status", "Int'l Workshop on Electroluminescence", 1990, pp. 137-143.

LEDs and Laser Diodes, Electus Distribution, copyright 2001, available at URL:http://www.jaycarcom.au/images_uploaded/ledlaser.Pdf.

Lester, S., et al., "High dislocation densities in high efficiency GaN-based light-emitting diodes", "Appl. Phys. Lett.", Mar. 6, 1995, pp. 1249-1251, vol. 66, No. 10.

Lumogen® F Violet 570 Data Sheet; available at the BASF Chemical Company website Lumogen® F Violet 570 Data Sheet; available at the BASF Chemical Company website URL,http://worldaccount.basf.com/wa/EUen_GB/Catalog/Pigments/doc4/BASF/PRD/30048274/.pdf?title=Technicai%20Datasheet&asset_type=pds/pdf&language=EN&urn=urn: documentum:eCommerce_soi_EU :09007bb280021e27.pdf:09007bb280021e27.pdf.

Mar. 2, 2009 Office Action in U.S. Appl. No. 10/623,198, issued by Abu I Kalam.

Mar. 22, 2012 Office Action in U.S. Appl. No. 12/131,119, issued by Steven Y. Horikoshi.

Mar. 28, 2006 Office Action in U.S. Appl. No. 10/623,198, issued by Thao X. Le.

(56) References Cited

OTHER PUBLICATIONS

Mar. 4, 2011 Notice of Allowance, Notice of Allowability, Examiners Interview Summary, Examiners Amendment/ Comment and Examiners Statement of Reason for Allowance in U.S. Appl. No. 11/264,124, issued by Abu I Kalam.
Mar. 7, 2008 Office Action in U.S. Appl. No. 10/623,198, issued by Abu I Kalam.
Maruska, H.P., "Gallium nitride light-emitting diodes (dissertation)", "Dissertation Submitted to Stanford University", Nov. 1973.
Maruska, H.P., et al., "Violet luminescence of Mg-doped GaN", "Appl. Phys. Lett.", Mar. 15, 1973, pp. 303-305, vol. 22, No. 6.
May 4, 2010 Office Action in U.S. Appl. No. 12/131,119.
McGraw-Hill, "McGraw-Hill Dictionary of Scientific and Technical Terms, Third Edition", "McGraw-Hill Dictionary of Scientific and Technical Terms", 1984, p. 912 and 1446, Publisher: McGraw-Hill.
McGraw-Hill, "McGraw-Hill Encyclopedia of Science and Technology, Sixth Edition", "McGraw-Hill Encyclopedia of Science and Technology", 1987, p. 582 and 60-63, vol. 9-10, Publisher: McGraw-Hill.
Mimura, Hidenori, et al., "Visible electroluminescence from uc-SiC/porous Si/c-Si p-n junctions", "Int. J. Optoelectron.", 1994, pp. 211-215, vol. 9, No. 2.
Miura, Noboru, et al., "Several Blue-Emitting Thin-Film Electroluminescent Devices", "Jpn. J. Appl. Phys.", Jan. 15, 1992, pp. L46-L48, vol. 31, No. Part 2, No. 1A IB.
Morkoc et al., "Large-band-gap SIC, 111-V nitride, and II-VI ZnSe-based semiconductor device technologies", J. Appl. Phys. 76(3), 1; Mar. 17, 1994; Illinois University.
Muench, W.V., et al., "Silicon carbide light-emitting diodes with epitaxial junctions", "Solid-State Electronics", Oct. 1976, pp. 871-874, vol. 19, No. 10.
Mukai, T., et al., "Recent progress of nitride-based light emitting devices", "Phys. Stat. Sol.", Sep. 2003, pp. 52-57, vol. 200, No. 1.
Nakamura, S., et al., "High-power InGaN single-quantum-well-structure blue and violet light-emitting diodes", "Appl. Phys. Lett.", Sep. 25, 1995, pp. 1868-1870, vol. 67, No. 13.
Nakamura, S., et al., "The Blue Laser Diode: GaN Based Light Emitters and Lasers", Mar. 21, 1997, p. 239, Publisher: Springer-Verlag.
Nakamura, S., et al., "The Blue Laser Diode: The Complete Story, 2nd Revised and Enlarged Edition", Oct. 2000, pp. 237-240, Publisher: Springer-Verlag.
Nov. 30, 2010 Office Action in U.S. Appl. No. 12/131,118.
Oct. 20, 2008 Office Action in U.S. Appl. No. 10/623,198
Pankove, J.I., et al., "Scanning electron microscopy studies of GaN", "Journal of Applied Physics", Apr. 1975, pp. 1647-1652, vol. 46, No. 4.
Pavan, P., et al., "Explanation of Current Crowding Phenomena Induced by Impact Ionization in Advanced Si Bipolar Transistors by Means of . . . ", "Microelectronic Engineering", 1992, pp. 699-702, vol. 19.
Pei, Q, et al., "Polymer Light-Emitting Electrochemical Cells", "Science", Aug. 25, 1995, pp. 1086-1088, vol. 269, No. 5227.
Reexam Advisory Action dated Sep. 28, 2012 for U.S. Appl. No. 90/010,940.
Reexam Final Office Action dated May 24, 2012 for U.S. Appl. No. 90/010,940.
Reexam Final Office Action dated Nov. 7, 2011 for U.S. Appl. No. 90/010,940.
Reexam Non-Final Office Action dated Jan. 26, 2012 for U.S. Appl. No. 90/010,940.
Reexam Non-Final Office Action dated Mar. 3, 2011 for U.S. Appl. No. 90/010,940.
Reexam Non-Final Office Action dated Sep. 20, 2010 for U.S. Appl. No. 90/010,940.
Roman. D., "LEDs Turn a Brighter Blue", "Electronic Buyers' News", Jun. 19, 1995, pp. 28 and 35, vol. 960, Publisher: CMP Media LLC.
Saleh and Teich, Fundamentals of Photonics, New York: John Wiley & Sons, 1991, pp. 592-594.
Sato, Yuichi, et al., "Full-color fluorescent display devices using a near-UV light-emitting diode", "Japanese Journal of Applied Physics", Jul. 1996, pp. L838-L839, vol. 35, No. ?A.
Sep. 17, 2009 Notice of Allowance, Notice of Allowability, Examiners Amendmeni/Comment, and Examiners Statement of Reasons for Allowance in U.S. Appl. No. 10/623,198, issued by Abul Kalam.
Sep. 29, 2009 Office Action in U.S. Appl. No. 11/264,124, issued by Abu I Kalam.
Tanaka, Shosaku, et al., "Bright white-light electroluminescence based on nonradiative energy transfer in Ce-and Eu-doped SrS thin films", "Applied Physics Letters", Nov. 23, 1987, pp. 1661-1663, vol. 51, No. 21.
Tanaka, Shosaku, et al., "White Light Emitting Thin-Film Electroluminescent Devices with SrS:Ce,Cl/ZnS:Mn Double Phosphor Layers", "Jpn. J. Appl. Phys.", Mar. 20, 1986, pp. L225-L227, vol. 25, No. 3.
The Penguin Dictionary of Electronics, 3rd edition, pp. 315, 437-438, 509-510, copyright 1979, 1988, and 1998.
Ura, M. , "Recent trends of development of silicon monocarbide blue-light emission diodes", "Kinzoku", 1989, pp. 11-15, vol. 59, No. 9.
Werner, K. , "Higher Visibility for LEDs", "IEEE Spectrum", Jul. 1994, pp. 30-39.
Wojciechowski, J. et al. , "Infrared-To-Blue Up-Converting Phosphor", "Electron Technology", 1978, pp. 31-47, vol. 11, No. 3.
Yamaguchi, Y. et al., "High-Brightness SiC Blue LEDS and Their Application to Full Color LED Lamps", "Optoelectronics-Devices and Technologies", Jun. 1992, pp. 57-67, vol. 7, No. 1.
Yang, Y., et al., "Voltage controlled two color light-emitting electrochemical cells", "Appl. Phys. Lett.", 1996, vol. 68, No. 19.
Yoshimi, Masashi, et al., "Amorphous carbon basis blue light electroluminescent device", "Optoelectronics- Devices and Technologies", Jun. 1992, pp. 69-81, vol. 7, No. 1.
Zanoni, E., et al., "Impact ionization, recombination, and visible light emission in ALGaAs/GaAs high electron mobility transistors", "J. Appl. Phys.", 1991, pp. 529-531, vol. 70, No. 1.
Zanoni, E., et al., "Measurements of Avalanche Effects and Light Emission in Advanced Si and SiGe Bipolar Transistors", "Microelectronic Engineering", 1991, pp. 23-26, vol. 15.
Zdanowski, Marek, "Pulse operating up-converting phosphor LED", "Electron Technol.", 1978, pp. 49-61, vol. 11, No. 3.
Zhiming, Chen, et al., "Amorphous thin film white-LED and its light-emitting mechanism", "Conference Record of the 1991 International Display Research Conference", Oct. 1991, pp. 122-125.
International Search Report and Written Opinion for PCT Appln. No. PCT/US2013/038454.
Non-final Office Action dated Jan. 31, 2014, for U.S. Appl. No. 13/769,210.
Final Office Action dated Sep. 8, 2014 for U.S. Appl. No. 13/769,210.
International Search Report & Written Opinion dated May 30, 2013 for PCT Appln. No. PCT/US2013/026050.
International Preliminary Report on Patentability dated Aug. 28, 2014 for PCT Appln. No. PCT/2013/026050.
European Search Report dated Oct. 12, 2015 for EP Appln. No. 13781431.5.

* cited by examiner ly from the LED 104 to different portions of the remote phosphor component 102.

METHODS AND APPARATUS FOR IMPLEMENTING COLOR CONSISTENCY IN REMOTE WAVELENGTH CONVERSION

CROSS-REFERENCES TO RELATED APPLICATIONS

This application claims the benefit of U.S. Provisional Application No. 61/639,048, filed on Apr. 26, 2012, the content of which is hereby incorporated by reference in its entirety.

FIELD

This disclosure relates to solid-state light emitting devices and lamps that utilize remote wavelength conversion using photoluminescence materials.

BACKGROUND

Color temperature is a characteristic of visible light that has important applications in lighting. The color temperature of a light source is the temperature of an ideal black-body radiator that radiates light of comparable hue to that of the light source. Color temperature is conventionally stated in the unit of absolute temperature, the kelvin, having the unit symbol K.

Typically, the color temperature of a white light source is determined predominantly by the mechanism used to generate the light. For example incandescent light sources typically have a relatively low color temperature around 3000K, called "warm white". Conversely, fluorescent lights have a higher color temperature around 7000K, called "cool white". The choice of warm or cool white is determined when purchasing the light source or when a building design or construction is completed. In many situations, such as street lighting, warm white and cool white light are used together.

Recently, white light emitting LEDs ("white LEDs") have become more popular and are rapidly being used to replace conventional fluorescent, compact fluorescent and incandescent light sources. White LEDs generally include one or more photoluminescent materials (e.g., one or more phosphor materials), which absorb a portion of the radiation emitted by the LED and re-emit light of a different color (wavelength). The phosphor material may be provided as a layer on, or incorporated within a wavelength conversion component that is located remotely from the LED. Typically, the LED generates blue light and the phosphor(s) absorbs a percentage of the blue light and re-emits yellow light or a combination of green and red light, green and yellow light, green and orange or yellow and red light. The portion of the blue light generated by the LED that is not absorbed by the phosphor material combined with the light emitted by the phosphor provides light which appears to the eye as being nearly white in color. Such white light LEDs are characterized by their long operating life expectancy (>50,000 hours) and high luminous efficacy (70 lumens per watt and higher).

For such white LEDs, light is emitted by photoluminescence rather than thermal radiation. Thus, the emitted radiation does not follow the form of a black-body spectrum. These sources are assigned what is known as a correlated color temperature (CCT). CCT is the color temperature of a black body radiator which to human color perception most closely matches the light from the lamp.

One concern with many white LED configurations is that they may generate light having inconsistent color emissions. For example, consider the lighting configuration shown in FIG. 1 which includes a blue LED light source 104 and a remote phosphor component 102. It can be seen that the remote phosphor component 102 has a tall and narrow aspect ratio, such that there are unequal distances from the LED 104 to different portions of the remote phosphor component 102. In operation, blue excitation light interacts with the phosphor material in component 102 to generate photoluminescence light. However, differing portions of the component 102 may receive differing levels of blue light and may also interact to different extents. This is due to many possible reasons. One possible reason is that, given the tall and narrow profile of the component 102, there exists many different distances for the conversion paths to convert the blue LED light into phosphor light. In addition, the angles at which the blue light is emitted from LED 104 causes at least some of the blue light to strike the inner surface of the component at angles above the critical angle thereby reflecting such light upwardly towards the top of the component 102 rather than coupling into the component and interacting with the phosphor. In contrast, at locations closest to the LED 104 blue light strikes the component at angles equal to or less than the critical angle thereby coupling into the component and interacting with the phosphor to generate converted light. Additionally differences in conversion path distances (i.e. the effective distance that light can travel through the component) can cause a shift in color over the length of the component 102.

Moreover, differing levels of emitted phosphor light from the component 102 contribute to shifts in color. Due to the isotropic nature of the photoluminescence process, photoluminescence light is emitted equally in all directions, resulting in converted light re-entering the interior of the component. In this way, light which is converted at one location on the component 102 may be "recycled" before being emitted from the lighting device at a different location on the component.

These problems potentially exist with any LED-based lighting architecture that may include long light paths from an excitation light source to a remote phosphor component. FIG. 2 illustrates how a light pipe 202 having side emission chambers 206 may generate shifts in color over the length of the component due to long light paths. Color shifts occur in the light pipe 202 due to excitation light not being evenly distributed from the LED source 204 due to the length of the light pipe. The unequal conversion paths may also be caused by indirect light paths from the LED 204 caused by reflective light off reflective surfaces 214 within the light pipe 202. The interior of the light pipe 202 may be filed with either air or an optical medium.

FIG. 3 illustrates a planar remote phosphor component 302 mounted over a wide mixing chamber 306, where the configuration includes a central excitation source 304. Color shifts occur due to excitation light not being evenly distributed from the center-only source 304 across the width of the planar phosphor component 302, both due to unequal length light paths directly from the LED 304 to the component 302, as well as unequal length reflective light paths caused by reflection off reflective surfaces 314 within the mixing chamber 306.

This problem is most visible in high aspect ratio configurations. Uniform components (such as domes and spheres) generally do not have this issue.

In many cases, visible inconsistencies in color over a lighting product can detrimentally affect the aesthetic appearance and usefulness of that product. Therefore, it is important for a light manufacturer to be able to construct a lamp having a consistent, advertised color.

BRIEF DESCRIPTION OF THE DRAWINGS

In order that the present invention is better understood lighting arrangements, light emitting devices and wavelength conversion components in accordance with embodiments of the invention will now be described, by way of example only, with reference to the accompanying drawings in which like reference numerals are used to denote like parts, and in which.

SUMMARY

Figure 1:
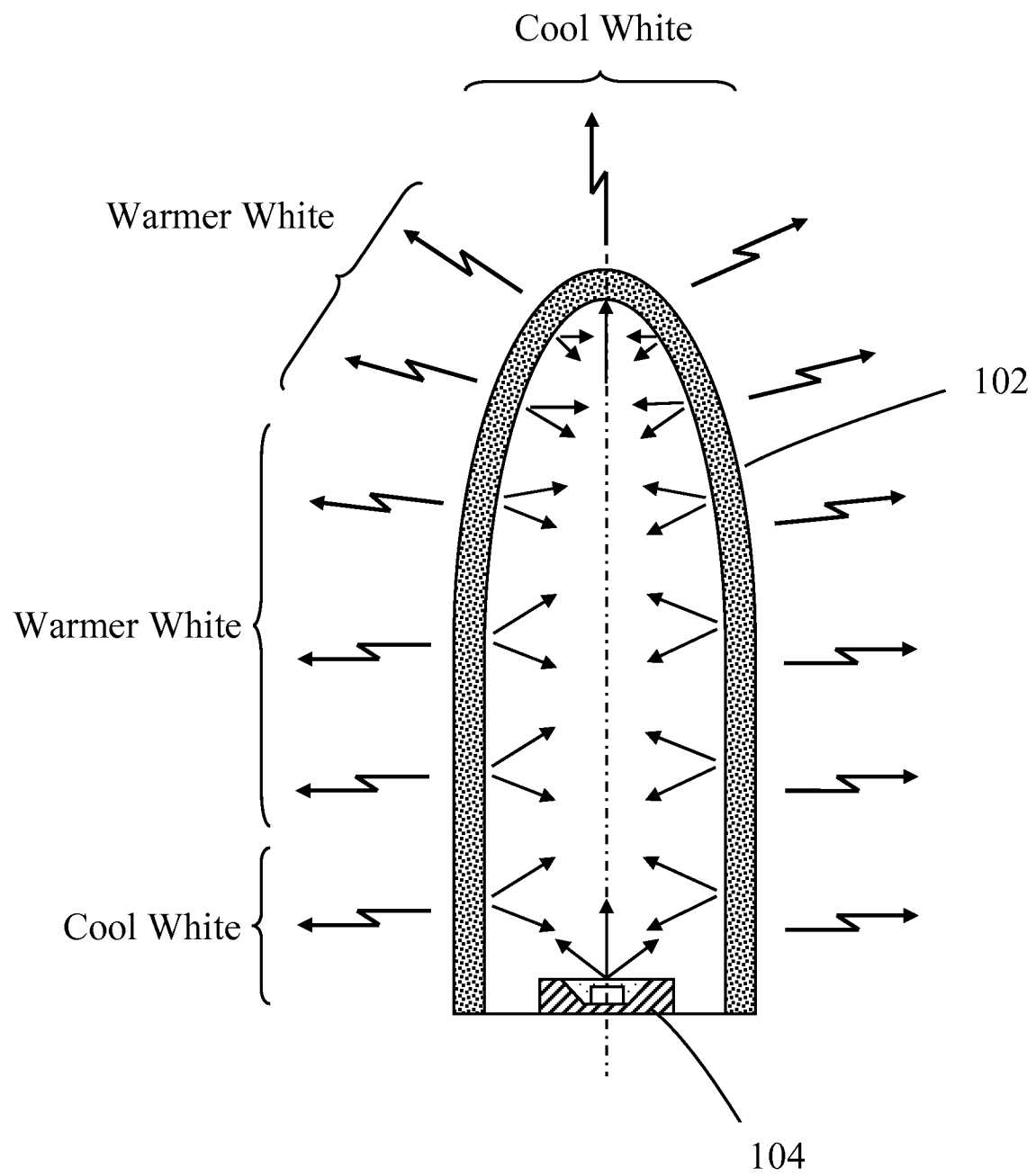
FIGS. 1-3 illustrate LED light devices having unequal length conversion paths for LED light.

Embodiments of the invention concern lighting arrangements and light emitting devices with remote wavelength conversion. The present invention provides an approach to implement lighting arrangements (architectures) which provides consistent color despite inconsistent light path lengths for phosphor light conversions. Various approaches can be taken to perform color tuning according to embodiments of the invention. In some embodiments, the thickness of the wavelength conversion component is varied to perform color tuning. According to other embodiments, phosphor loading and/or concentrations can be varied within the component to perform color tuning.

According to some embodiments, an LED lighting arrangement comprises at least one LED operable to emit light of a first wavelength range and a wavelength conversion component that is operable to emit light of a second wavelength range when excited by light of the first wavelength range from the at least one LED. The emitted light from the LED lighting arrangement comprises combined light from both the at least one LED and the wavelength conversion component, where the wavelength conversion component is remote from the at least one LED. The wavelength conversion component has differing amounts of photoluminescent materials at different portions of the wavelength conversion component, wherein a visibly uniform color of light is producible from the LED lighting arrangement based at least in part on the differing amounts of photoluminescent materials at different portions of the wavelength conversion component.

The differing amounts of the photoluminescent materials is implemented to generally equalize a ratio of emitted photoluminescence light compared to emitted LED light from the wavelength conversion component. The differing amounts of photoluminescent materials at the different portions of the wavelength conversion component can be implemented by different ways. In one embodiment, varying wall thicknesses is implemented for the wavelength conversion component. For example, the wavelength conversion component is planar in shape, and a central portion is thicker than an edge portion of the wavelength conversion component. The wavelength conversion component may also be generally dome-shaped, and a lower wall portion comprises thicker walls compared to a central wall portion of the wavelength conversion component.

The lighting arrangement may also be implemented where the differing amounts of photoluminescent materials at the different portions of the wavelength conversion component is implemented by varying concentration of the photoluminescent materials within the wavelength conversion component. The differing amounts of photoluminescent materials at the different portions of the wavelength conversion component can also be implemented by varying thickness of a photoluminescent material layer on a substrate in the wavelength conversion component. The photoluminescent material layer can be implemented with a pattern that is not contiguous over the wavelength conversion component. In some embodiments, the pattern comprises at least one of dots or pixels of the photoluminescent materials at variable size or frequency over the photoluminescent material layer.

In some embodiments, more of the photoluminescent material is provided at portions of the wavelength conversion component receiving having higher levels of LED light and less of the photoluminescent material is provided at portions of the wavelength conversion component receiving having lower levels of LED light.

Some embodiments are directed to a wavelength conversion component that is operable to emit light of a second wavelength range when excited by light of the first wavelength range from at least one LED, where emitted light comprises combined light from both the at least one LED and the wavelength conversion component. Differing amounts of photoluminescent materials are present at different portions of the wavelength conversion component, where a visibly uniform color of light is producible based at least in part on the differing amounts of photoluminescent materials at different portions of the wavelength conversion component.

The differing amounts of photoluminescent materials at the different portions of the wavelength conversion component can be implemented in various ways, and is to generally equalize a ratio of emitted photoluminescent light compared to emitted LED light from the wavelength conversion component. The differing amounts of photoluminescent materials at the different portions of the wavelength conversion component can be implemented by different ways. In one embodiment, varying wall thicknesses is implemented for the wavelength conversion component. For example, the wavelength conversion component is planar in shape, and a central portion is thicker than an edge portion of the wavelength conversion component. The wavelength conversion component may also be generally dome-shaped, and a lower wall portion comprises thicker walls compared to a central wall portion of the wavelength conversion component.

The lighting arrangement may also be implemented where the differing amounts of photoluminescent materials at the different portions of the wavelength conversion component is implemented by varying concentration of the photoluminescent materials within the wavelength conversion component. The differing amounts of photoluminescent materials at the different portions of the wavelength conversion component can also be implemented by varying thickness of a photoluminescent material layer on a substrate in the wavelength conversion component. The photoluminescent material layer can be implemented with a pattern that is not contiguous over the wavelength conversion component. In some embodiments, the pattern comprises at least one of dots or pixels of the photoluminescent materials at variable size or frequency over the photoluminescent material layer.

The wavelength conversion component according to the invention may comprise any shape. In some embodiments, the wavelength conversion component comprises a three-dimensional shape (such as a generally dome shaped shell) having an aspect ratio that is not one to one, e.g., greater than or less than 1:1 ratio. The wavelength conversion component may also comprise a planar shape, and a combination of the planar shape with a mixing chamber corresponds to an aspect ratio that is not one to one. In some embodiments, a mixing chamber exists for the wavelength conversion component having a three-dimensional shape, where the interior of the wavelength conversion component in combination with a substrate forms a mixing chamber.

The wavelength conversion component may be planar in shape, and a central portion is thicker than an edge portion of the wavelength conversion component. The wavelength conversion component may be generally dome-shaped, with a lower wall portion having thicker walls compared to a central wall portion of the wavelength conversion component.

Some embodiments are directed to a method for color tuning an LED lighting arrangement, comprising identifying at least one LED operable to emit light of a first wavelength range and configuring a wavelength conversion component that is operable to emit light of a second wavelength range when excited by light of the first wavelength range from the at least one LED. The emitted light from the LED lighting arrangement comprises combined light from both the at least one LED and the wavelength conversion component, and the wavelength conversion component being remote from the at least one LED. The wavelength conversion component is color tuned by implementing differing amounts of photoluminescent materials at different portions of the wavelength conversion component, wherein a visibly uniform color of light is producible from the LED lighting arrangement based at least in part on the differing amounts of photoluminescent materials at different portions of the wavelength conversion component.

The differing amounts of photoluminescent materials at the different portions of the wavelength conversion component is implemented by at least one of (a) varying wall thicknesses for the wavelength conversion component, (b) varying concentration of the photoluminescent materials within the wavelength conversion component, or (c) varying thickness of a photoluminescent material layer on a substrate in the wavelength conversion component.

Profiles of the at least one LED and the wavelength conversion component are analyzed to configure the differing amounts of the photoluminescent materials to generally equalize a ratio of emitted photoluminescent light compared to emitted LED light from the wavelength conversion component. The profile of the at least one LED that is analyzed comprises an emission profile, and the profile of the wavelength conversion component comprises an aspect ratio for the wavelength conversion component or for a mixing chamber that incorporates the wavelength conversion component. Simulation can be performed to analyze the at least one LED and the wavelength conversion component. A physical sample of the wavelength conversion component is analyzed and adjusted to perform color tuning.

Further details of aspects, objects, and advantages of the invention are described below in the detailed description, drawings, and claims. Both the foregoing general description and the following detailed description are exemplary and explanatory, and are not intended to be limiting as to the scope of the invention.

DETAILED DESCRIPTION

As noted above, problems with color inconsistencies may exist in lighting architectures having unequal light path lengths from an excitation light source to a remote phosphor component. The present invention provides an approach to implement lighting architectures which provides consistent color despite inconsistent light path lengths for phosphor light conversions.

Various embodiments are described hereinafter with reference to the figures. It should be noted that the figures are not necessarily drawn to scale. It should also be noted that the figures are only intended to facilitate the description of the embodiments, and are not intended as an exhaustive description of the invention or as a limitation on the scope of the invention. In addition, an illustrated embodiment need not have all the aspects or advantages shown. An aspect or an advantage described in conjunction with a particular embodiment is not necessarily limited to that embodiment and can be practiced in any other embodiments even if not so illustrated. Also, reference throughout this specification to "some embodiments" or "other embodiments" means that a particular feature, structure, material, or characteristic described in connection with the embodiments is included in at least one embodiment. Thus, the appearance of the phrase "in some embodiment" or "in other embodiments" in various places throughout this specification are not necessarily referring to the same embodiment of embodiments.

For the purposes of illustration only, the present description is made with reference to photoluminescent materials embodied specifically as phosphor materials. However, the invention is applicable to any type of photoluminescent material, such as either phosphor materials or quantum dots. A quantum dot is a portion of matter (e.g. semiconductor) whose excitons are confined in all three spatial dimensions that may be excited by radiation energy to emit light of a particular wavelength or range of wavelengths. As such, the invention is not limited to phosphor based wavelength conversion components unless claimed as such.

As previously discussed, FIG. 1 shows an example lighting arrangement that may include color shift problems due to unequal path lengths. One possible cause of the shifts in color is the nature of blue light conversion that occurs. Within the lighting arrangement, with each successive collision of blue excitation light from LED 104 with the remote phosphor component 102, a proportion of the blue light is absorbed and converted by a process of photoluminescence into light of a different color (e.g., green, yellow, or red). The further the excitation light travels through the remote phosphor component, the more collisions that take place, leaving a higher percentage of phosphor light versus the original blue light from the excitation source (LED 104).

Therefore, in high aspect ratio components (e.g., greater than 1:1) like the one shown in FIG. 1, light generated at the base is "cooler" because it has a higher proportion of blue light to photoluminescence light since the excitation primarily comes from the blue light source (LED). Blue light is converted into warm light by the phosphor. Further away from the blue light source, the illumination primarily comes from "recycled" light thus causing an external color shift from cool at the base to warmer at the top.

The invention solves this problem by color tuning the wavelength conversion component to ensure a consistent emission of color from the lighting arrangement. Various approaches can be taken to perform color tuning according to embodiments of the invention. In some embodiments, the thickness of the wavelength conversion component is varied to perform color tuning. According to other embodiments, phosphor loading and/or concentrations can be varied within the component to perform color tuning.

Figure 4:
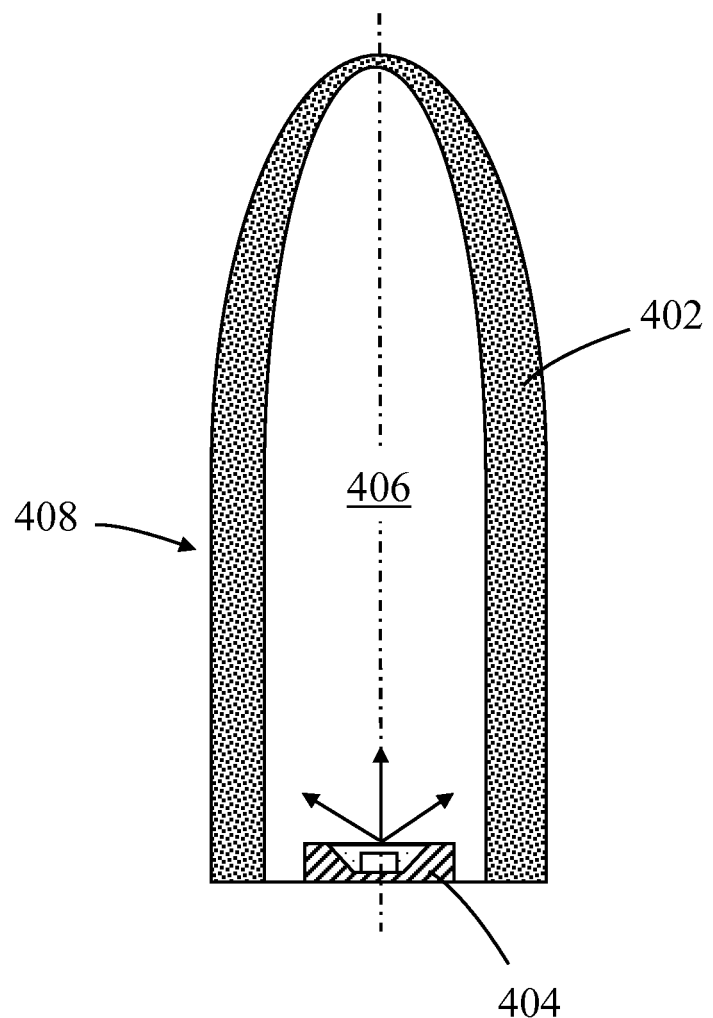
FIG. 4 illustrates an embodiment of the invention in which variable thickness is utilized to perform color tuning.

FIG. 4 illustrates an embodiment of the invention in which variable thickness is utilized to perform color tuning. In this approach, the thickness of the walls 408 of the remote phosphor component 402 determines the amount of blue light from the excitation light source (LED) 404 that is converted into photoluminescence light versus that amount of blue light that passes through the component without being converted. Varying the thickness of the walls 408 on component 402 permits adjustments/tuning of this ratio of conversion.

Near the excitation source 404, the light is primarily coming from the blue LED 404. In this region, a thicker wall is used to convert more of the blue light into photoluminescence light. As the light travels farther away from the LED 404, more blue light is converted to photoluminescence light. In response, the wall thickness is reduced, proportionately to reduce the conversion ratio of blue light to photoluminescence light and to thereby allow blue light to pass more easily through the component 402. By varying the wall thickness this reduces the variation in the ratio of blue light to photoluminescence light resulting in a more uniform color emission over the entire length of the component 402.

This approach therefore provides a solution to the color shift problem that is both efficient and simple to manufacture. This approach also increases conversion efficiencies since light is not required to pass through more phosphor than is required to generate light of a desired color.

Figure 5:
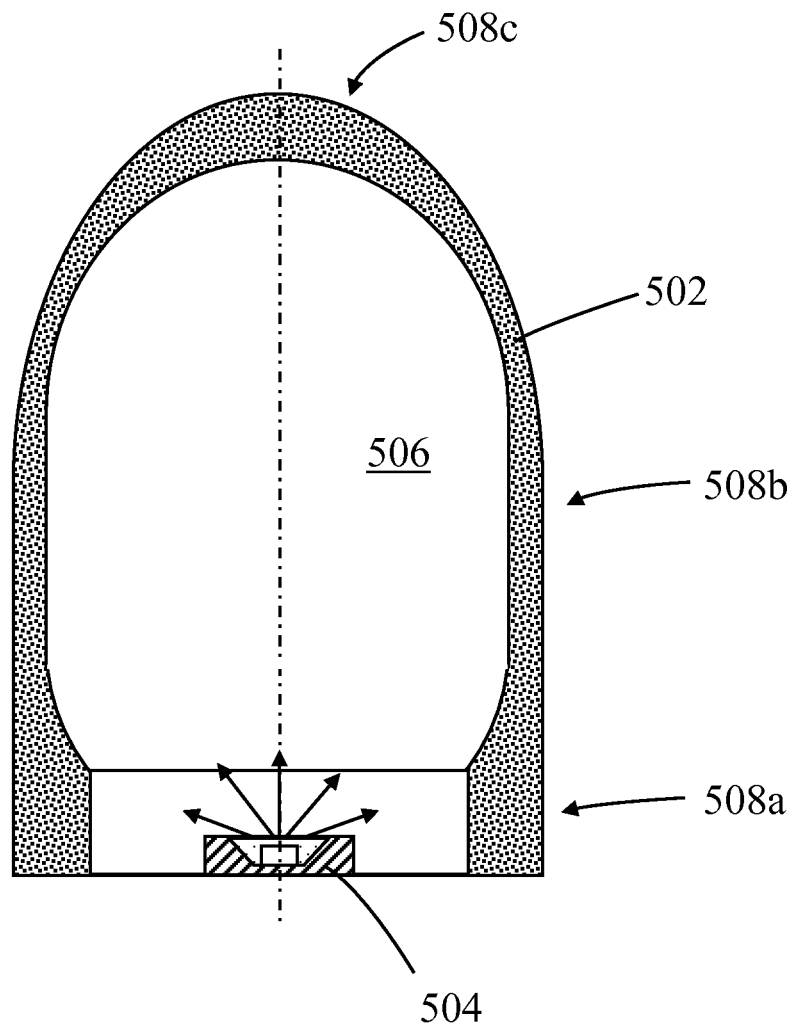
FIG. 5 shows a configuration for a wavelength conversion component having thicker walls at both the lower portion and upper portion, with thinner walls in the middle portion of the component.

The different wall thicknesses are tuned to match emissions characteristics of the LED light source, the aspect ratio of the remote phosphor component, and the expected interactions that occur between the emitted excitation light and the phosphor component. As such, the wall thicknesses can be provided in any appropriate configuration suitable to effect consistent color over the length of the component. For example, it is possible that the lighting architecture results in relatively higher amounts of blue light being emitted from both the top and bottom portions of the component, causing cooler light colors at those portions of the component and a shift towards warmer colors emitted from the central portion of the component. FIG. 5 shows a configuration for the wavelength conversion component 502 having thicker walls at both the lower portion 508a and upper portion 508c of the component (where a relatively higher ratio of blue light would otherwise be emitted), with thinner walls in the middle portion 508b (where a relatively lower ratio of blue light would otherwise be emitted). The result is a more uniform emission of color from this lighting arrangement.

Figure 6:
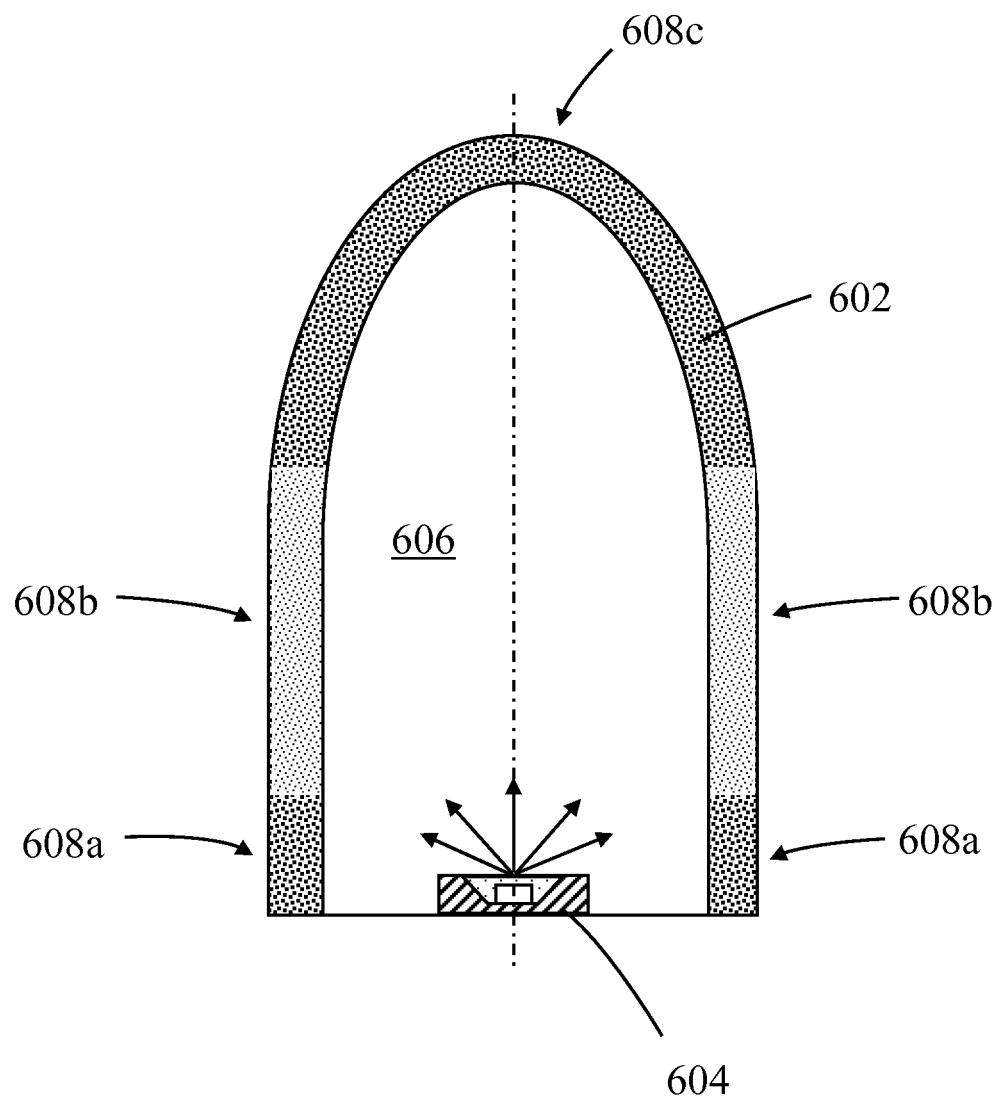
FIG. 6 illustrates an alternate embodiment, in which color tuning is effected by changing the loading of the phosphor materials within different portions of the component.

FIG. 6 illustrates an alternate embodiment, in which color tuning is effected by changing the loading of the phosphor materials within different portions of the component 602. In this approach, the amount and/or concentration of phosphor within the material that make up the phosphor is adjusted to control the conversion ratio of blue light and the amount of blue light that passes through the component 602. In this example, since the aspect ratio is greater than 1:1, the concentration of phosphor materials in the lower portions 608a of the component wall is greater than the concentration of phosphor materials in the central portions 608b of the component 602. The concentration at portion 608c may also be separately increased/decreased depending upon whether the emitted color from that portion needs to be tuned. In configurations where the aspect ratio is less than 1:1, the concentration of phosphor materials may be reversed, where the concentration in the lower portions of the component wall is less than the concentration of phosphor materials in the upper portions of the component.

Figure 7:
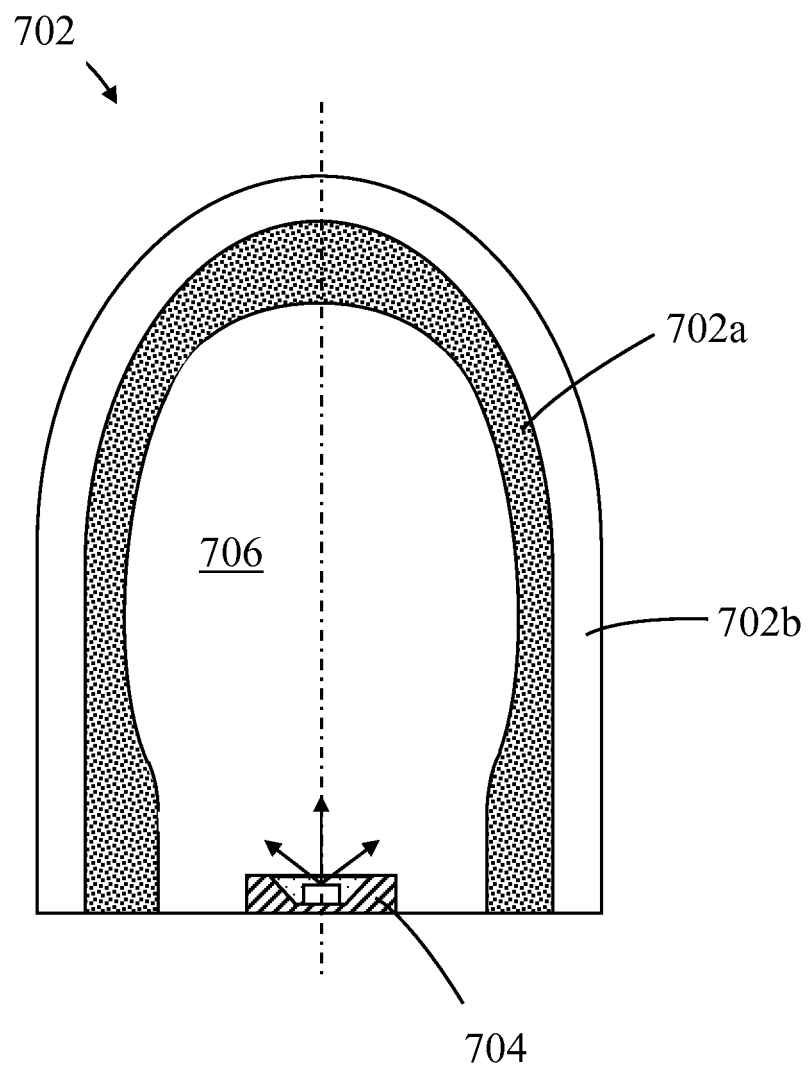
FIG. 7 illustrates an approach in which the phosphor in a wavelength conversion component is deposited as a layer of material onto a transparent substrate, and color tuning is effected by changing the thickness of the phosphor layer on the substrate.

FIG. 7 illustrates yet another approach that can be taken tune colors for the lighting arrangement. In this approach, the phosphor in wavelength conversion component 702 is deposited as a layer of material 702a onto a transparent substrate 702b, and color tuning is effected by changing the thickness of the phosphor layer 702a on the substrate 702b. The thickness of the phosphor layer 702a is adjusted to control the ratio of blue light that is converted by the phosphor materials into photoluminescence light. Any suitable deposition approach can be taken to vary the thickness of the phosphor layer. For example, any one of printing, spraying, or coating techniques may be used to implement the phosphor layer 702a and to control the thickness of that layer.

Figure 2:
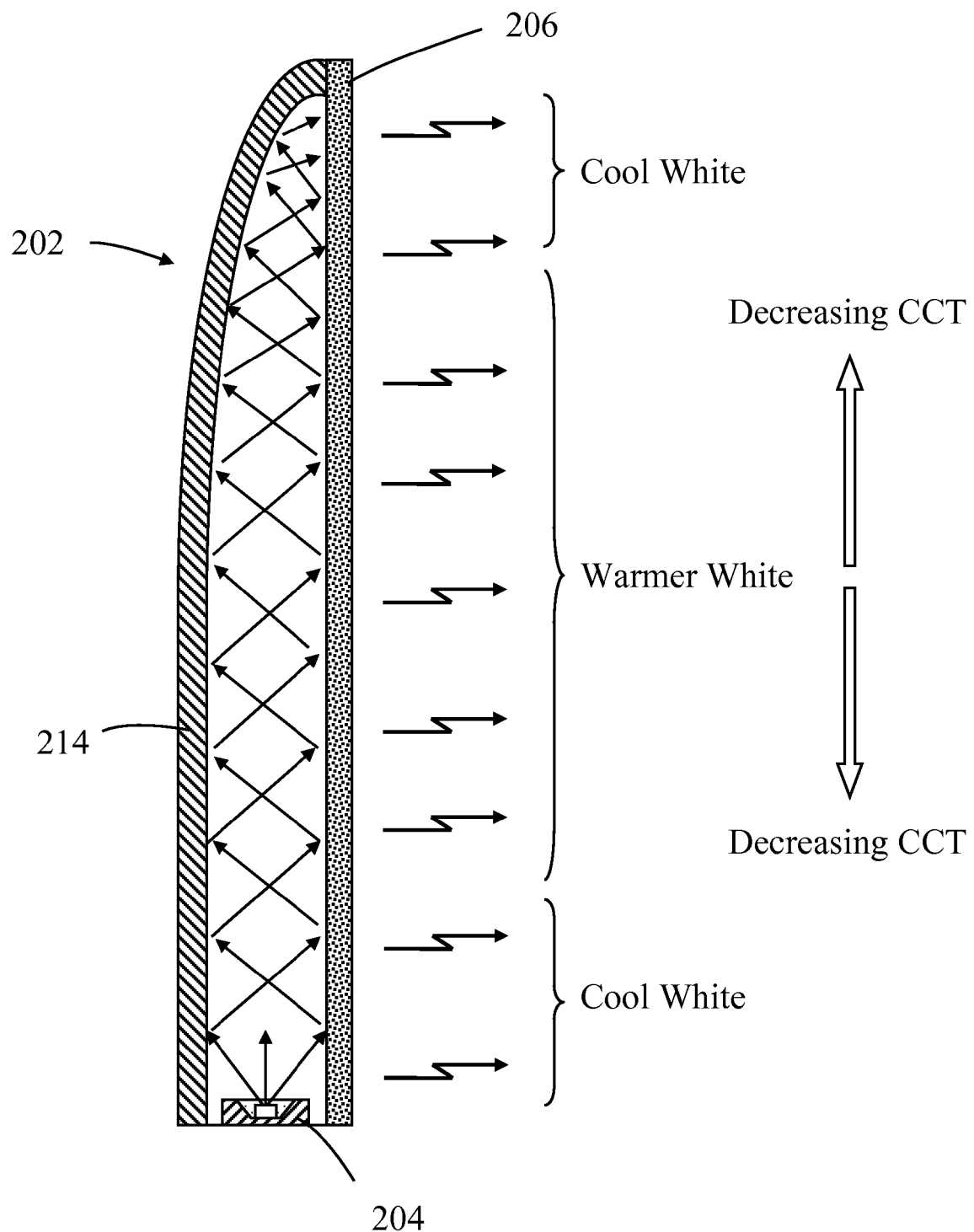
Figure 3:
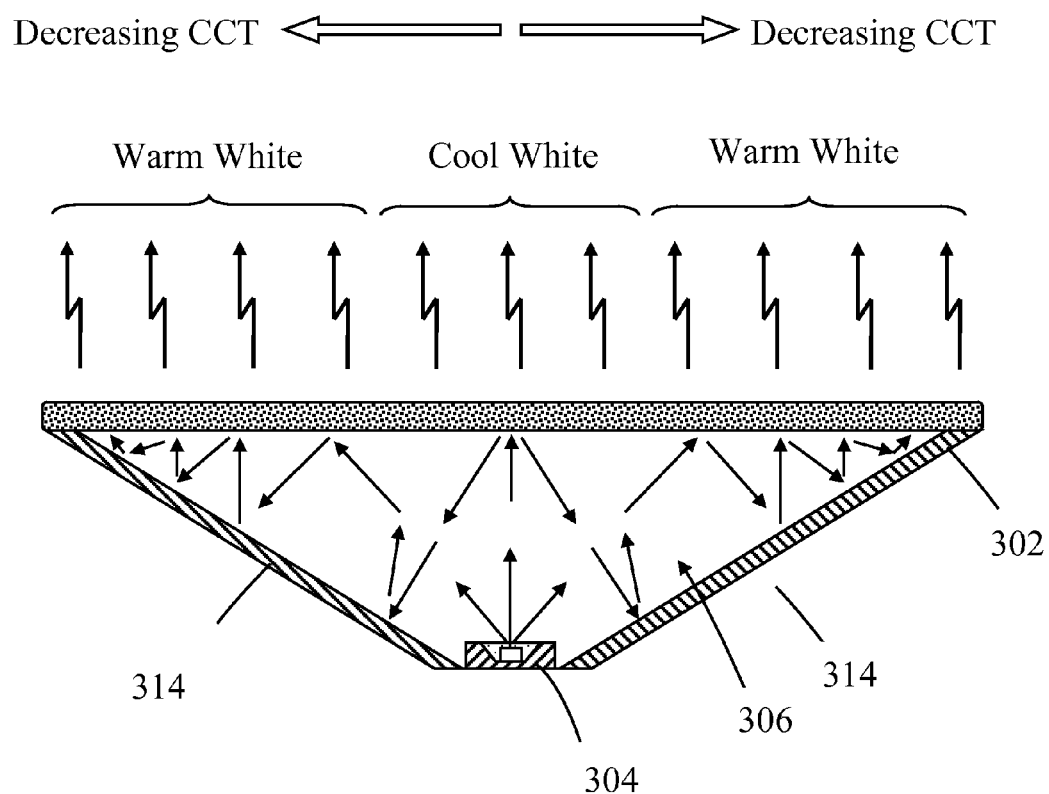
Figure 8:
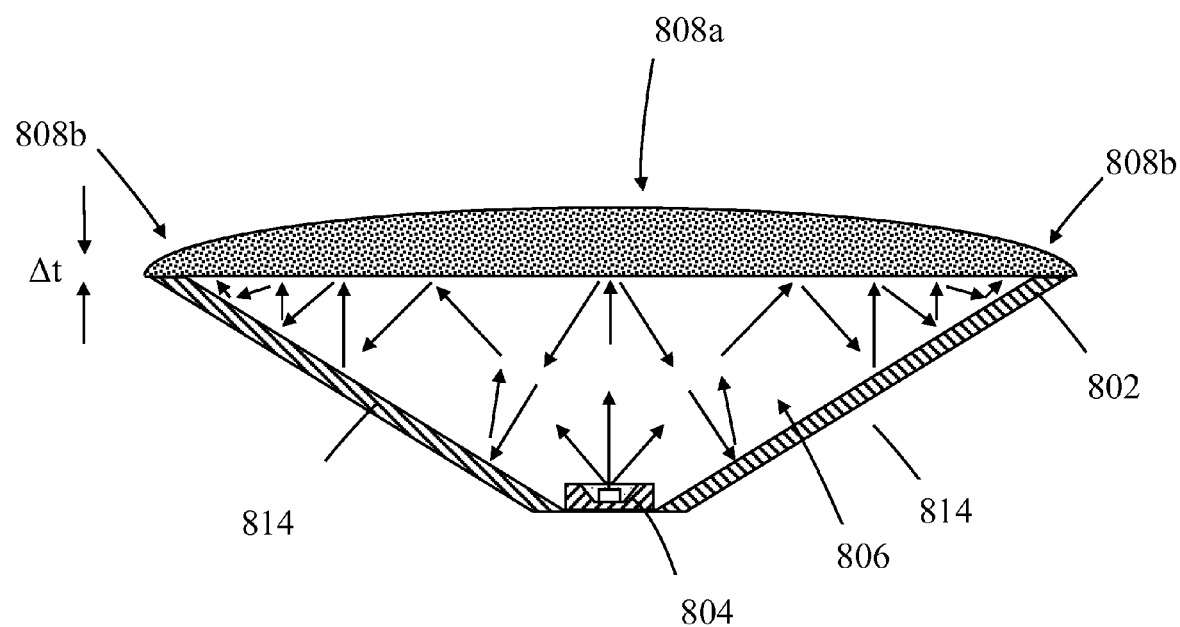
FIG. 8 illustrates an embodiment where the thickness t of a planar wavelength conversion component is adjusted to control the conversion ratio of the blue excitation light from an LED.

This color shift problems may also exist in lighting arrangement that use planar wavelength conversion components. Recall that FIG. 3 illustrates a planar remote phosphor component over a wide mixing chamber having a central excitation source, where color shifts occur due to excitation light not being evenly distributed from the center-only source over the length of the phosphor component. FIG. 8 illustrates an embodiment of a solution to this problem, where the thickness t of the planar wavelength conversion component 802 is adjusted to control the conversion ratio of the blue excitation light from LED 804. In this illustrative configuration, the highest ratio of blue light to photoluminescence light would otherwise be emitted from the central portion 808a of the component. As such, color tuning is performed by increasing the thickness of the component at that central portion 808a. In contrast, the lowest ratio of blue light to photoluminescence light would likely be emitted from the edges 808b of the planar component. Therefore, color tuning is performed by decreasing the thickness of the component at the edge portions 808b. Assuming a gradient shift in color this configuration, then tuning is performed by having a gradient change in thickness from the central portion 808a to the edge portion 808b of the component 802. This approach can similarly be applied to perform color tuning of the light pipe configuration illustrated in FIG. 2.

Figure 9A:
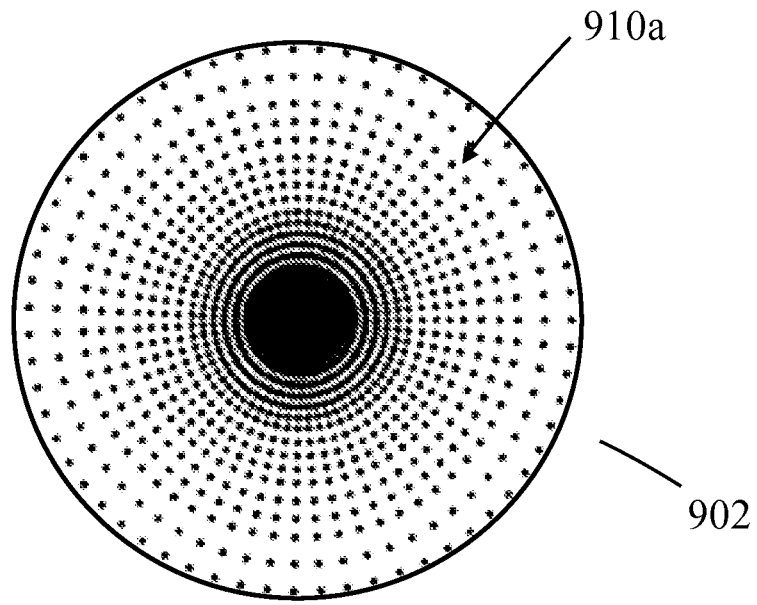
FIGS. 9A-9B illustrate embodiments where the print layer thicknesses is controlled by either using a patterning approach or by using multiple print layers combined with patterning to create different phosphor layer thicknesses.
Figure 9B:
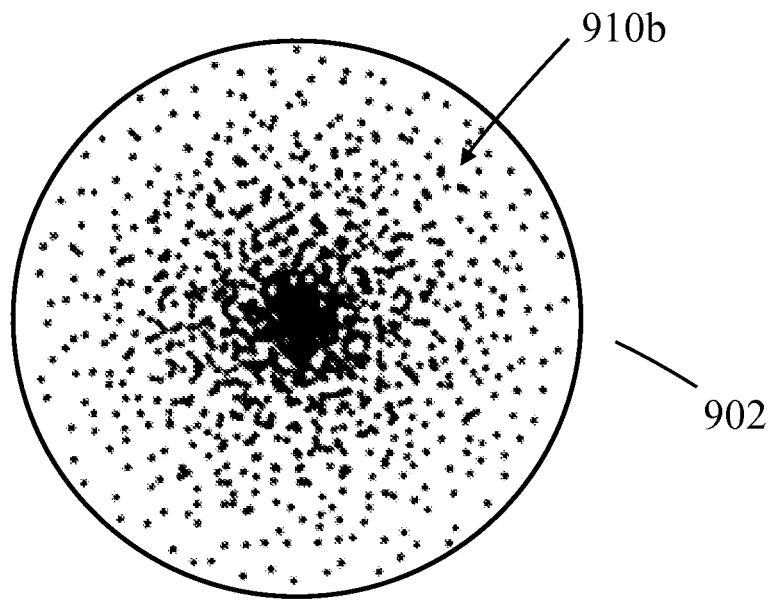

Another possible solution for the planar and light pipe configurations is to control the phosphor thicknesses when applied as a phosphor layer onto a substrate. As illustrated in FIGS. 9A-9B, the print layer thicknesses for the wavelength conversion component 902 can be controlled, for example, by either using a patterning approach 910a or 910b or by using multiple print layers combined with patterning to create different phosphor layer thicknesses. In light pipes, it is possible the layers do not need to be contiguous over the entire panel. Instead, pixels and/or dots may be printed at variable dot size and for frequency distributed over the panel.

Figure 10A:
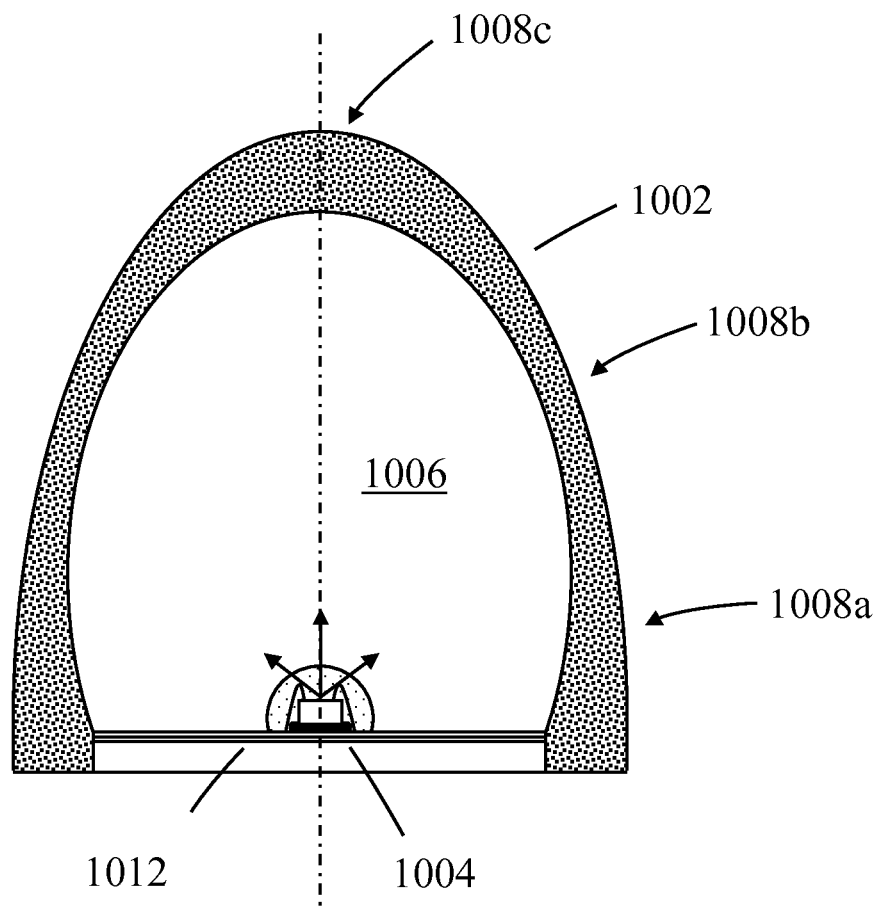
FIGS. 10A and 10B illustrate views of an example of light emitting devices that utilize remote wavelength conversion according to embodiments of the invention.
Figure 10B:
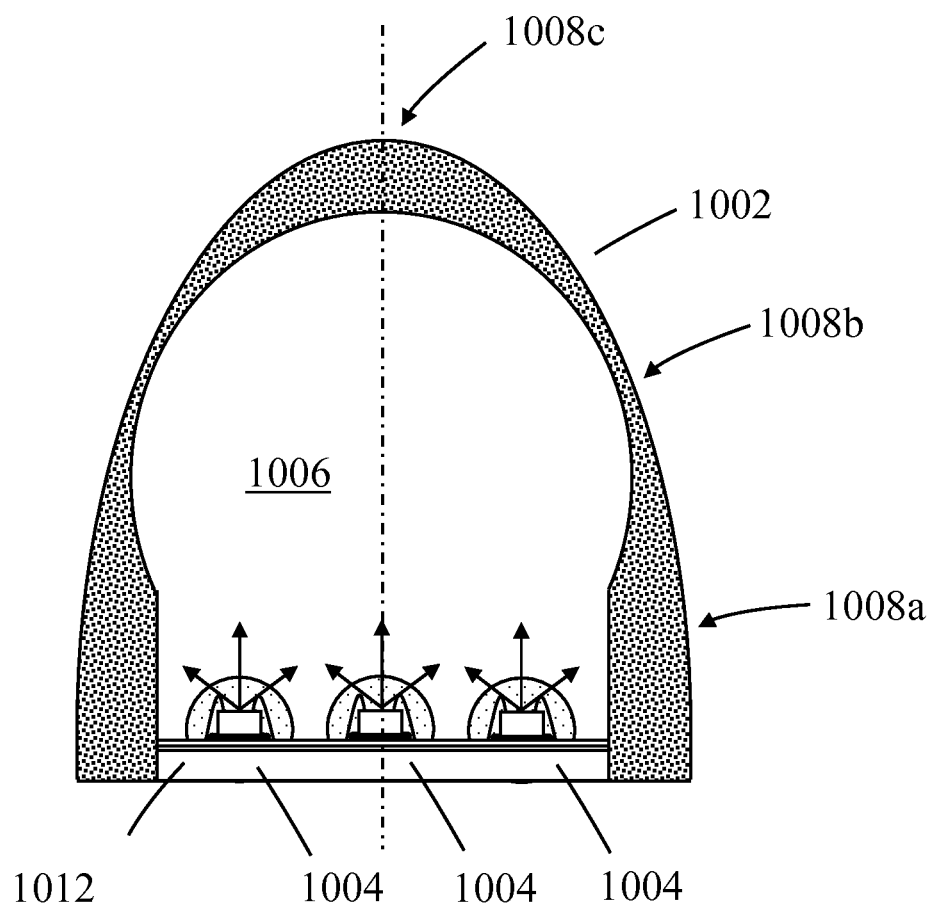

FIGS. 10A and 10B illustrate views of an example of light emitting devices 1000 that utilize remote wavelength conversion according to embodiments of the invention. The device 1000 comprises a dome-shaped wavelength conversion component 1002 that is mounted onto a substrate 1012.

In some embodiments, the substrate 1012 comprises a MCPCB (metal core printed circuit board). As is known a MCPCB comprises a layered structure composed of a metal core base, typically aluminum, a thermally conducting/electrically insulating dielectric layer and a copper circuit layer for electrically connecting electrical components in a desired circuit configuration.

The LEDs 1004 may be configured in various arrangements. The device 1000 according to the embodiment of FIG. 10A comprises a single LED 1004 while the device 1000 of according to the embodiment of FIG. 10B comprises a plurality/array of blue light emitting LEDs (blue LEDs) 1004 that are mounted to the substrate 1012 of the device 1000. The LEDs 1004 can be implemented using any suitable solid-state light emitter device, such as a blue light emitting diode (LED). Each solid-state light emitter can comprise a gallium nitride-based blue light emitting LED, such as a 1 W InGaN/GaN (indium gallium nitride/gallium nitride) based LED chip which is operable to generate blue light of wavelength 400 to 465 nm. In some embodiments, the LEDs 1004 are configured such that their principle emission axis is parallel with the axis of the lighting device 1000.

The wavelength conversion component 1002 may comprise phosphor material. In this situation, the color of the emission product produced by the wavelength conversion component will depend on the phosphor material composition and the quantity of phosphor material per unit area in the wavelength conversion component.

In the present invention, the wavelength conversion component 1002 is configured to tune the light emissions characteristics of the device 1000 to produce consistent color emissions over all (or part) of its exterior. In some embodiments, color tuning is performed by varying the thickness of the walls for the wavelength conversion component 1002. For example, since the aspect ratio is greater than 1:1, the concentration of phosphor materials in the lower portions 1008a of the component wall may be configured to be greater than the concentration of phosphor materials in the central portions 1008b of the component 1002. The concentration at top portion 1008c may also be separately increased/decreased depending upon whether the emitted color from that portion needs to be tuned.

In an alternate embodiment, the concentration of phosphors within the wavelength conversion component 1002 is adjusted to color tune the device 1000. In some embodiments the wavelength conversion component 1002 may include a wavelength conversion layer comprising photoluminescent material situated on a light transmissive substrate, where the thickness and/or loading of the wavelength conversion layer is adjusted to perform color tuning.

The wavelength conversion component 1002 comprises any suitable photoluminescent materials, and may comprise an inorganic or organic phosphor such as for example silicate-based phosphor of a general composition $A_3Si(O,D)_5$ or $A_2Si(O,D)_4$ in which Si is silicon, O is oxygen, A comprises strontium (Sr), barium (Ba), magnesium (Mg) or calcium (Ca) and D comprises chlorine (Cl), fluorine (F), nitrogen (N) or sulfur (S). Examples of silicate-based phosphors are disclosed in U.S. Pat. No. 7,575,697 B2 "Silicate-based green phosphors", U.S. Pat. No. 7,601,276 B2 "Two phase silicate-based yellow phosphors", U.S. Pat. No. 7,655,156 B2 "Silicate-based orange phosphors" and U.S. Pat. No. 7,311,858 B2 "Silicate-based yellow-green phosphors". The phosphor can also comprise an aluminate-based material such as is taught in co-pending patent application US2006/0158090 A1 "Novel aluminate-based green phosphors" and U.S. Pat. No. 7,390,437 B2 "Aluminate-based blue phosphors", an aluminum-silicate phosphor as taught in co-pending application US2008/0111472 A1 "Aluminum-silicate orange-red phosphor" or a nitride-based red phosphor material such as is taught in co-pending United States patent application US2009/0283721 A1 "Nitride-based red phosphors" and International patent application WO2010/074963 A1 "Nitride-based red-emitting in RGB (red-green-blue) lighting systems". It will be appreciated that the phosphor material is not limited to the examples described and can comprise any phosphor material including nitride and/or sulfate phosphor materials, oxy-nitrides and oxy-sulfate phosphors or garnet materials (YAG).

The wavelength conversion component 1002 is operable to absorb a proportion of the blue light $\lambda_1$ generated by the LEDs 1004 and convert it to light of a different wavelength by a process of photoluminescence (i.e. converting light to $\lambda_2$). Not all of the blue light $\lambda_1$ generated by the LEDs 1004 is absorbed by the wavelength conversion component 1002 and some of it is emitted. The emission product of the device 1000 thus comprises the combined light of wavelength $\lambda_1$ generated by the LEDs 1004 and the wavelength $\lambda_2$ generated by the wavelength conversion component 1002. Light generated by the wavelength conversion component 1002 refers to the emitted light resulting from conversion of the LED light into light of a different wavelength through photoluminescence. The CCT of the emission product is thus a combination of the CCT of the light generated by the LED ($\lambda_1$) and the CCT of the light ($\lambda_2$) generated by the wavelength conversion component 1002. Color tuning is performed by adjusting the characteristics of different portions of the wavelength conversion component to change the overall CCT of those portions of the component, so that a more uniform CCT is provided over all or substantially all of the component.

The color tuning is performed to specifically address emissions characteristics of the LED light source, the aspect ratio of the remote phosphor component, and the expected interactions that occur between the emitted excitation light and the phosphor component. The relative characteristics of these components may differ from one lighting arrangement to another lighting arrangement, thereby necessitating different tuning arrangements as needed. For example, the wavelength conversion component of FIG. 10A having a single LED blue light source is different from the configuration of FIG. 10B having multiple LED blue light sources, though the external shape of the component is the same for each configuration. Therefore, it is likely that, even if all other aspects of the configuration are the same or similar (such as the aspect ratio of the wavelength conversion component), the color tuning will result in different levels of wall thicknesses needed to provide consistent color.

Figure 11:
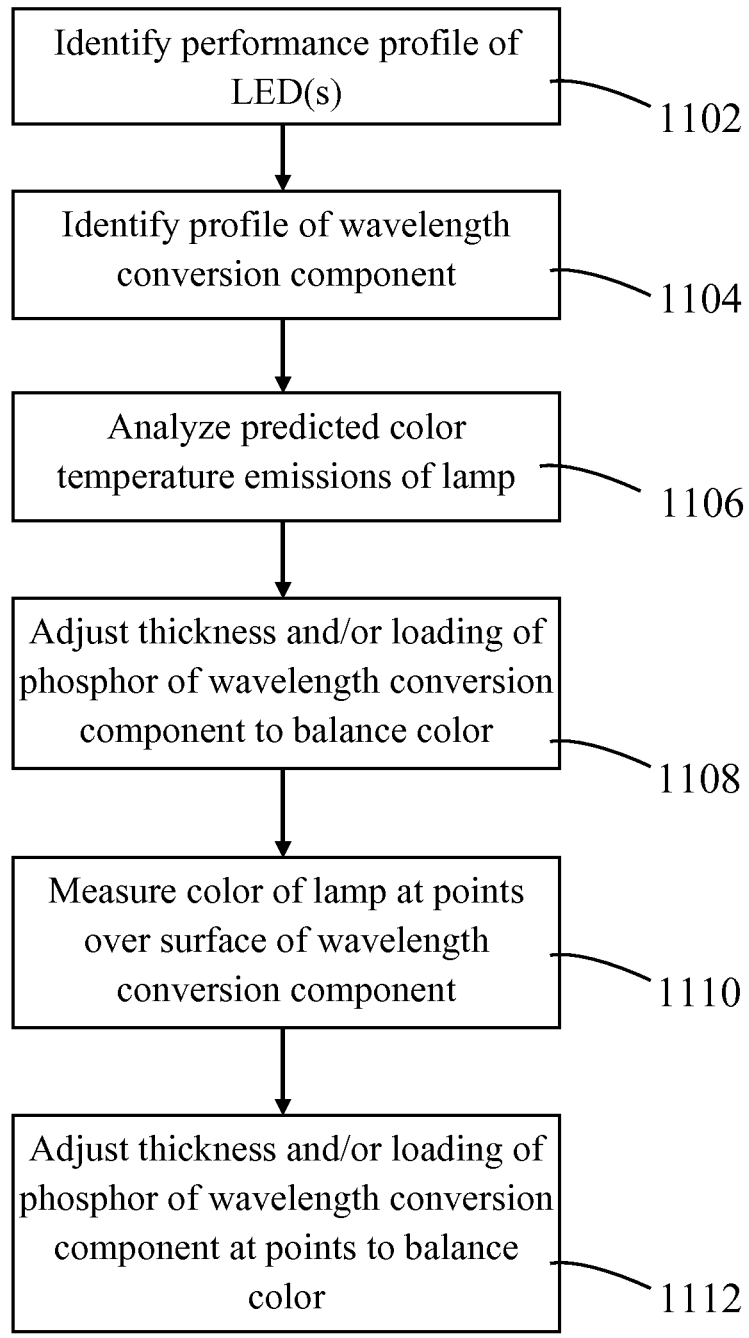
FIG. 11 illustrates a flowchart of a method for tuning a light-emitting device in accordance with some embodiments.

FIG. 11 illustrates a flowchart of a method for tuning a light-emitting device in accordance with some embodiments. At 1102, the performance profile of the LED(s) for the lighting arrangement is identified. This step identifies the expected light emission pattern to be generated by the one or more LEDs used in the lighting arrangement, e.g., by using a polar diagram to identify expected light distribution patterns from the LED(s).

At 1104, identification is made of the physical profile for the wavelength conversion component. In some embodiments for three-dimensional components, this step is performed by identifying the aspect ratio and/or dimensions of the component. For two-dimensional components, this step is performed by identifying the shape and/or dimensions of the component.

In addition, the expected configuration of the LED(s) relative to the wavelength configuration component can be identified at this point. This step identifies the expected placement of the one or more LEDs relative to the wavelength conversion component.

Next, at 1106, analysis is performed to predict the expected color emissions from the different portions of the component. In one embodiment, a model is constructed of the lighting arrangement, and computer-based simulation, using for example a ray tracing program, is performed to predict the expected color emissions from the lighting arrangement.

At 1108, based on at least the analysis results, the wavelength conversion component is configured to provide uniform color emissions. Any suitable manner of configurations may be performed for this step. For example, the wall thickness of the component may be adjusted to balance color emissions by the lighting arrangement. Additional analysis/simulations may be performed to determine whether the expected performance of the configuration provides uniform color emissions.

A sample lighting arrangement is then manufactured having the configuration from step 1108. The lighting arrangement is physically tested at 1110 to determine whether the arrangement will produce uniform color emissions in real world conditions.

At 1112, adjustments can be made to fine-tune the design configurations. For example, wall thicknesses can be expanded and/or contracted at various portions of the wavelength conversion component. Thereafter, the design is finalized and ready for manufacture.

Any suitable approach can be taken to manufacture the lighting device of the invention. For example, injection molding may be performed to manufacture color tuned wavelength conversion components. In the embodiment where color tuning is performed by adjusting wall thicknesses, then the injection molding process merely needs to produce desired thicknesses at specific locations for the component. In the embodiment where color tuning is performed by adjusting phosphor concentrations, then the component can be co-injection moding such that different parts of the component have different loadings and/or concentrations of photoluminescent materials. Alternatively the component the molding process can occur in stages, where different source materials and/or combinations of source materials having differing phosphor levels are provided when molding the parts of the component intended to have differing concentrations of the phosphor materials.

In the foregoing specification, the invention has been described with reference to specific embodiments thereof. It will, however, be evident that various modifications and changes may be made thereto without departing from the broader spirit and scope of the invention. For example, the above described wavelength conversion components are described without specific reference to any optical mediums within an interior of the components and/or within a mixing chamber. In fact, the invention is applicable with any interior configuration, including where the interiors of the wavelength conversion component and/or the mixing chamber are filed with either air or an optical medium. The specification and drawings are, accordingly, to be regarded in an illustrative rather than restrictive sense.

What is claimed is:

1. An LED lighting arrangement comprising:
    at least one LED operable to emit light of a first wavelength range;
    a wavelength conversion component that is operable to emit light of a second wavelength range when excited by light of the first wavelength range from the at least one LED, wherein emitted light from the LED lighting arrangement comprises combined light from both the at least one LED and the wavelength conversion component; the wavelength conversion component being remote from the at least one LED; and the wavelength conversion component having differing amounts of photoluminescent materials at different portions of the wavelength conversion component, wherein a visibly uniform color of light is producible from the LED lighting arrangement based at least in part on the differing amounts of photoluminescent materials at different portions of the wavelength conversion component;
    wherein the differing amounts of photoluminescent materials at the different portions of the wavelength conversion component are implemented by varying thickness of a photoluminescent material layer on a substrate in the wavelength conversion component; and
    wherein the photoluminescent material layer is implemented with a pattern that is not contiguous over the wavelength conversion component.

2. The lighting arrangement of claim 1, wherein the differing amounts of photoluminescent materials at the different portions of the wavelength conversion component are further implemented by varying wall thicknesses for the wavelength conversion component.

3. The lighting arrangement of claim 2, wherein the wavelength conversion component is planar in shape, and a central portion is thicker than an edge portion of the wavelength conversion component.

4. The lighting arrangement of claim 1, in which the pattern comprises at least one of dots or pixels of the photoluminescent materials at variable size or frequency over the photoluminescent material layer.

5. The lighting arrangement of claim 1, wherein the differing amounts of the photoluminescent materials are implemented to generally equalize a ratio of emitted photoluminescent light compared to emitted LED light from the wavelength conversion component.

6. The lighting arrangement of claim 1, wherein more of the photoluminescent materials is provided at portions of the wavelength conversion component receiving having higher levels of LED light and less of the photoluminescent materials is provided at portions of the wavelength conversion component receiving having lower levels of LED light.

7. The lighting arrangement of claim 1, wherein the wavelength conversion component comprises a three-dimensional shape having an aspect ratio that is not one to one.

8. The lighting arrangement of claim 7, wherein the wavelength conversion component comprises a generally dome shape, and the generally dome shape corresponds to an aspect ratio greater than one to one.

9. The lighting arrangement of claim 1, wherein the wavelength conversion component comprises a planar shape, and a combination of the planar shape with a mixing chamber corresponds to an aspect ratio that is not one to one.

10. The lighting arrangement of claim 1, wherein the photoluminescent materials comprise at least one of phosphor material or quantum dots.

11. The lighting arrangement of claim 1, wherein the differing amounts of photoluminescent materials at the different portions of the wavelength conversion component are further implemented by varying concentration of the photoluminescent materials within the wavelength conversion component.

12. An LED lighting arrangement comprising:
    at least one LED operable to emit light of a first wavelength range;
    a wavelength conversion component that is operable to emit light of a second wavelength range when excited by light of the first wavelength range from the at least one LED, wherein emitted light from the LED lighting arrangement comprises combined light from both the at least one LED and the wavelength conversion component; the wavelength conversion component being remote from the at least one LED; and the wavelength conversion component having differing amounts of photoluminescent materials at different portions of the wavelength conversion component, wherein a visibly uniform color of light is producible from the LED lighting arrangement based at least in part on the differing amounts of photoluminescent materials at different portions of the wavelength conversion component;

wherein the differing amounts of photoluminescent materials at the different portions of the wavelength conversion component are implemented by varying wall thicknesses for the wavelength conversion component; and wherein the wavelength conversion component is generally dome-shaped, and a lower wall portion comprises thicker walls compared to a central wall portion of the wavelength conversion component.

13. The lighting arrangement of claim 12, wherein the differing amounts of photoluminescent materials at the different portions of the wavelength conversion component are further implemented by varying concentration of the photoluminescent materials within the wavelength conversion component.

14. The lighting arrangement of claim 12, wherein the differing amounts of photoluminescent materials at the different portions of the wavelength conversion component are further implemented by varying thickness of a photoluminescent material layer on a substrate in the wavelength conversion component.

15. The lighting arrangement of claim 12, wherein the differing amounts of the photoluminescent materials are implemented to generally equalize a ratio of emitted photoluminescent light compared to emitted LED light from the wavelength conversion component.

16. The lighting arrangement of claim 12, wherein more of the photoluminescent materials is provided at portions of the wavelength conversion component receiving having higher levels of LED light and less of the photoluminescent materials is provided at portions of the wavelength conversion component receiving having lower levels of LED light.

17. The lighting arrangement of claim 12, wherein the photoluminescent materials comprise at least one of phosphor material or quantum dots.

18. A component for an LED lighting arrangement, comprising:
a wavelength conversion component that is operable to emit light of a second wavelength range when excited by light of a first wavelength range from at least one LED, wherein emitted light comprises combined light from both the at least one LED and the wavelength conversion component, and in which differing amounts of photoluminescent materials are present at different portions of the wavelength conversion component, wherein a visibly uniform color of light is producible based at least in part on the differing amounts of photoluminescent materials at different portions of the wavelength conversion component;

wherein the differing amounts of photoluminescent materials at the different portions of the wavelength conversion component are implemented by varying wall thicknesses for the wavelength conversion component; and wherein the wavelength conversion component is generally dome-shaped, and a lower wall portion comprises thicker walls compared to a central wall portion of the wavelength conversion component.

19. The component of claim 18, wherein the differing amounts of photoluminescent materials at the different portions of the wavelength conversion component are further implemented by varying concentration of the photoluminescent materials within the wavelength conversion component.

20. The component of claim 18, wherein the differing amounts of photoluminescent materials at the different portions of the wavelength conversion component are further implemented by varying thickness of a photoluminescent material layer on a substrate in the wavelength conversion component.

21. The component of claim 18, wherein the differing amounts of the photoluminescent materials are implemented to generally equalize a ratio of emitted photoluminescent light compared to emitted LED light from the wavelength conversion component.

22. The component of claim 18, wherein more of the photoluminescent materials is provided at portions of the wavelength conversion component configured to receive having higher levels of LED light and less of the photoluminescent materials is provided at portions of the wavelength conversion component configured to receive having lower levels of LED light.

23. A component for an LED lighting arrangement, comprising:
a wavelength conversion component that is operable to emit light of a second wavelength range when excited by light of a first wavelength range from at least one LED, wherein emitted light comprises combined light from both the at least one LED and the wavelength conversion component, and in which differing amounts of photoluminescent materials are present at different portions of the wavelength conversion component, wherein a visibly uniform color of light is producible based at least in part on the differing amounts of photoluminescent materials at different portions of the wavelength conversion component;

wherein the differing amounts of photoluminescent materials at the different portions of the wavelength conversion component are implemented by varying thickness of a photoluminescent material layer on a substrate in the wavelength conversion component; and wherein the photoluminescent material layer is implemented with a pattern that is not contiguous over the wavelength conversion component.

24. The component of claim 23, wherein the differing amounts of photoluminescent materials at the different portions of the wavelength conversion component are further implemented by varying wall thicknesses for the wavelength conversion component.

25. The component of claim 24, wherein the wavelength conversion component is planar in shape, and a central portion is thicker than an edge portion of the wavelength conversion component.

26. The component of claim 23, in which the pattern comprises at least one of dots or pixels of the photoluminescent materials at variable size or frequency over the photoluminescent material layer.

27. The component of claim 23, wherein the differing amounts of the photoluminescent materials are implemented to generally equalize a ratio of emitted photoluminescent light compared to emitted LED light from the wavelength conversion component.

28. The component of claim 23, wherein more of the photoluminescent materials is provided at portions of the wavelength conversion component configured to receive having higher levels of LED light and less of the photoluminescent materials is provided at portions of the wavelength conversion component configured to receive having lower levels of LED light.

29. The component of claim 23, wherein the wavelength conversion component comprises a three-dimensional shape having an aspect ratio that is greater than or less than one to one.

30. The component of claim 29, wherein the wavelength conversion component comprises a generally dome shape, and the generally dome shape corresponds to an aspect ratio greater than one to one.

31. The component of claim 23, wherein the wavelength conversion component comprises a planar shape, and a combination of the planar shape with a mixing chamber corresponds to an aspect ratio that is not one to one.

32. The component of claim 23, wherein the differing amounts of photoluminescent materials at the different portions of the wavelength conversion component are further implemented by varying concentration of the photoluminescent materials within the wavelength conversion component.

33. A method for color tuning an LED lighting arrangement comprising:
identifying at least one LED operable to emit light of a first wavelength range;
configuring a wavelength conversion component that is operable to emit light of a second wavelength range when excited by light of the first wavelength range from the at least one LED, wherein emitted light from the LED lighting arrangement comprises combined light from both the at least one LED and the wavelength conversion component; the wavelength conversion component being remote from the at least one LED; and the wavelength conversion component is color tuned by implementing differing amounts of photoluminescent materials at different portions of the wavelength conversion component, wherein a visibly uniform color of light is producible from the LED lighting arrangement based at least in part on the differing amounts of photoluminescent materials at different portions of the wavelength conversion component;
wherein profiles of the at least one LED and the wavelength conversion component are analyzed to configure the differing amounts of the photoluminescent materials to generally equalize a ratio of emitted photoluminescent light compared to emitted LED light from the wavelength conversion component; and
wherein the profile of the at least one LED that is analyzed comprises an emission profile and the profile of the wavelength conversion component comprises an aspect ratio for the wavelength conversion component or for a mixing chamber that incorporates the wavelength conversion component.

34. The method of claim 33, wherein the differing amounts of photoluminescent materials at the different portions of the wavelength conversion component is implemented by at least one of (a) varying wall thicknesses for the wavelength conversion component, (b) varying concentration of the photoluminescent materials within the wavelength conversion component, or (c) varying thickness of a photoluminescent material layer on a substrate in the wavelength conversion component.

35. The method of claim 33, wherein simulation is performed to analyze the at least one LED and the wavelength conversion component.

36. The method of claim 33, wherein a physical sample of the wavelength conversion component is analyzed and adjusted to perform color tuning.

* * * * *